United States Patent
Wu et al.

(10) Patent No.: US 8,927,386 B2
(45) Date of Patent: Jan. 6, 2015

(54) METHOD FOR MANUFACTURING DEEP-TRENCH SUPER PN JUNCTIONS

(75) Inventors: Tzong Shiann Wu, Wuxi (CN); Genyi Wang, Wuxi (CN); Leibing Yuan, Wuxi (CN); Pengpeng Wu, Wuxi (CN)

(73) Assignees: CSMC Technologies FAB1 Co., Ltd., Wuxi (CN); CSMC Technologies FAB2 Co., Ltd., Wuxi (CN)

( * ) Notice: Subject to any disclaimer, the term of this patent is extended or adjusted under 35 U.S.C. 154(b) by 15 days.

(21) Appl. No.: 13/878,453

(22) PCT Filed: May 31, 2012

(86) PCT No.: PCT/CN2012/076353
§ 371 (c)(1),
(2), (4) Date: Apr. 9, 2013

(87) PCT Pub. No.: WO2012/167715
PCT Pub. Date: Dec. 13, 2012

(65) Prior Publication Data
US 2013/0196489 A1      Aug. 1, 2013

(30) Foreign Application Priority Data

Jun. 8, 2011  (CN) .......................... 2011 1 0151784

(51) Int. Cl.
*H01L 21/04*    (2006.01)
*H01L 21/761*    (2006.01)
*H01L 29/66*    (2006.01)
*H01L 29/06*    (2006.01)
*H01L 21/3065*    (2006.01)

(52) U.S. Cl.
CPC ...... *H01L 29/66136* (2013.01); *H01L 29/0619* (2013.01); *H01L 21/3065* (2013.01)
USPC ............... 438/416; 438/3; 438/222; 438/356; 438/481

(58) Field of Classification Search
None
See application file for complete search history.

(56) References Cited

U.S. PATENT DOCUMENTS

| 5,923,073 | A | * | 7/1999 | Aoki et al. | ................... 257/501 |
| 8,159,039 | B2 | * | 4/2012 | Cheng | ........................... 257/506 |
| 2007/0072398 | A1 | * | 3/2007 | Shibata et al. | ............... 438/478 |
| 2011/0306189 | A1 | * | 12/2011 | Cheng et al. | .................. 438/488 |
| 2013/0149822 | A1 | * | 6/2013 | Lee et al. | ...................... 438/212 |

\* cited by examiner

*Primary Examiner* — Zandra Smith
*Assistant Examiner* — Pamela E Perkins
(74) *Attorney, Agent, or Firm* — Anova Law Group, PLLC

(57) ABSTRACT

The present invention provides a method for manufacturing a deep-trench super PN junction. The method includes: a deposition step for forming an epitaxial layer on a substrate; forming a first dielectric layer and a second dielectric layer in sequence on the epitaxial layer; forming deep trenches in the epitaxial layer; completely filling the deep trenches with an epitaxial material and the epitaxial material is beyond the second dielectric layer; filling the entire surface of the second dielectric layer and the epitaxial layer such as Si using a third dielectric to from a surface filling layer with a predetermined height; etching back on the surface filling layer to the interface of the first dielectric layer and the epitaxial layer; and a removing step for removing the first dielectric layer, the second dielectric layer and the surface filling layer to planarize Si epitaxial material.

19 Claims, 3 Drawing Sheets

METHOD FOR MANUFACTURING DEEP-TRENCH SUPER PN JUNCTIONS

FIELD OF THE INVENTION

The present invention relates to the field of semiconductor manufacturing technologies and, more particularly, to a method for manufacturing deep-trench super PN junctions (Super Junctions).

BACKGROUND OF THE INVENTION

In the field of semiconductor, the super PN junction technique used to improve the performance of power MOS has become significantly prominent in high-voltage applications.

The conventional fabrication process of super PN junctions mainly includes deep trench etching, epitaxial filling, and silicon CMP planarizing.

Specifically, the conventional fabrication process of a super PN junction includes following steps:

Step 1: forming a single thick epitaxial layer (N type) on an N+ silicon substrate;

Step 2: forming deep trenches in the epitaxial layer. Specifically, first forming a thermal oxide layer, then depositing a silicon nitride layer, then depositing a plasma enhanced chemical vapor deposition oxide layer, by etching the above mentioned three layers to the silicon substrate, then removing the photoresist, and use the above mentioned three layers as a hard mask to do a etching process to form deep trenches, then removing the plasma enhanced chemical vapor deposition oxide layer using a wet etching method.

Step 3: forming super PN junctions by filling the deep trenches with epitaxial silicon (P type).

Step 4: planarizing the surface of the silicon substrate using a CMP process.

However, with respect to the CMP process used herein, because equipment for the CMP process is usually used in the back-end-of-line processing, they cannot be shared with the fabrication process of a super PN junction. Therefore the conventional fabrication process of a super junction utilizing the CMP process to obtain planarization often needs dedicated CMP equipment, which causes difficult process control and increased production cost.

SUMMARY OF THE INVENTION

Based on the above-mentioned problems, the objective of the present invention is to provide a method for manufacturing super PN junctions which would be compatible with the conventional fabrication process, and would have high production efficiency.

According to the present invention, a method for manufacturing a deep-trench super PN junction includes:

a deposition step for forming an epitaxial layer on a substrate;

a dielectric forming step for forming the first dielectric layer and the second dielectric layer in sequence on the epitaxial layer;

a deep trench step for forming deep trenches in the epitaxial layer;

a first filling step for completely filling the deep trenches to be beyond the second dielectric layer with an epitaxial material;

a second filling step for forming a surface filling layer with a predetermined thickness by completely filling the second dielectric layer and the epitaxial layer using a third dielectric;

an etching step for performing an etch back process on the surface filling layer to the interface of the first dielectric layer and the epitaxial layer; and a removing step for removing the first dielectric layer, the second dielectric layer and the surface filling layer to planarize the epitaxial layer.

Preferably, the above mentioned etching process, use a plasma etching process.

Preferably, in the second filling process, use an accessory equipment to fill the third dielectric layer and the above mentioned third dielectric is a flowable dielectric.

By using the present invention to substitute the CMP of the existing technique, and also using the flowable dielectric and a plasma etch back process, therefore, the problems caused by utilizing the CMP to planarize, such as more complex process, more difficult process control and high production cost, can be effectively solved.

Preferably, the plasma etching process can be controlled by adjusting the selective etching rate ratio to obtain a selective rate ratio of 1:1 for the epitaxial material and the third dielectric.

Preferably, the height of the surface filling layer is at least higher than the highest point of the epitaxial material.

Preferably, in the second filling process, the flowable third dielectric completely fills the entire surface of the second dielectric and the epitaxial material by spin, coating.

Preferably, in the removing process, use wet process to remove all layers.

Preferably, in the first filling process, the lowest point of the epitaxial material is beyond the interface of the first dielectric and the epitaxial material.

Preferably, the first dielectric is oxide, the second dielectric is nitride, the epitaxial material is Si, and the third dielectric is SOG.

Preferably, the thickness forming of the first dielectric is greater than 500 Å, and the thickness forming of the second dielectric is greater than 300 Å.

As described above, by filling the flowable dielectric material and using the plasma etch back process, silicon planarization can be achieved using the processes compatible with the existing fabrication process, without dedicated CMP equipment. Thus, the disclosed method has the advantages of simple process, high efficiency and low cost, and can avoid the unstable problems of Si devices caused by using the CMP process.

DETAILED DESCRIPTION OF THE INVENTION

The followings describe certain embodiments among various possible embodiments, for the purpose of providing the basic aspects of the present invention. They are not intended to confirm any necessary and/or decisive elements of the present invention, or to limit the protection scope of the present invention.

In order to illustrate more clearly the purpose, the technical solutions, and the advantages of the present invention, details will be described with accompanying drawings in the followings.

Followings, as shown in FIGS. 1-5, are descriptions of a fabrication process of a deep trench super PN junction consistent with the disclosed embodiments.

Figure 1:
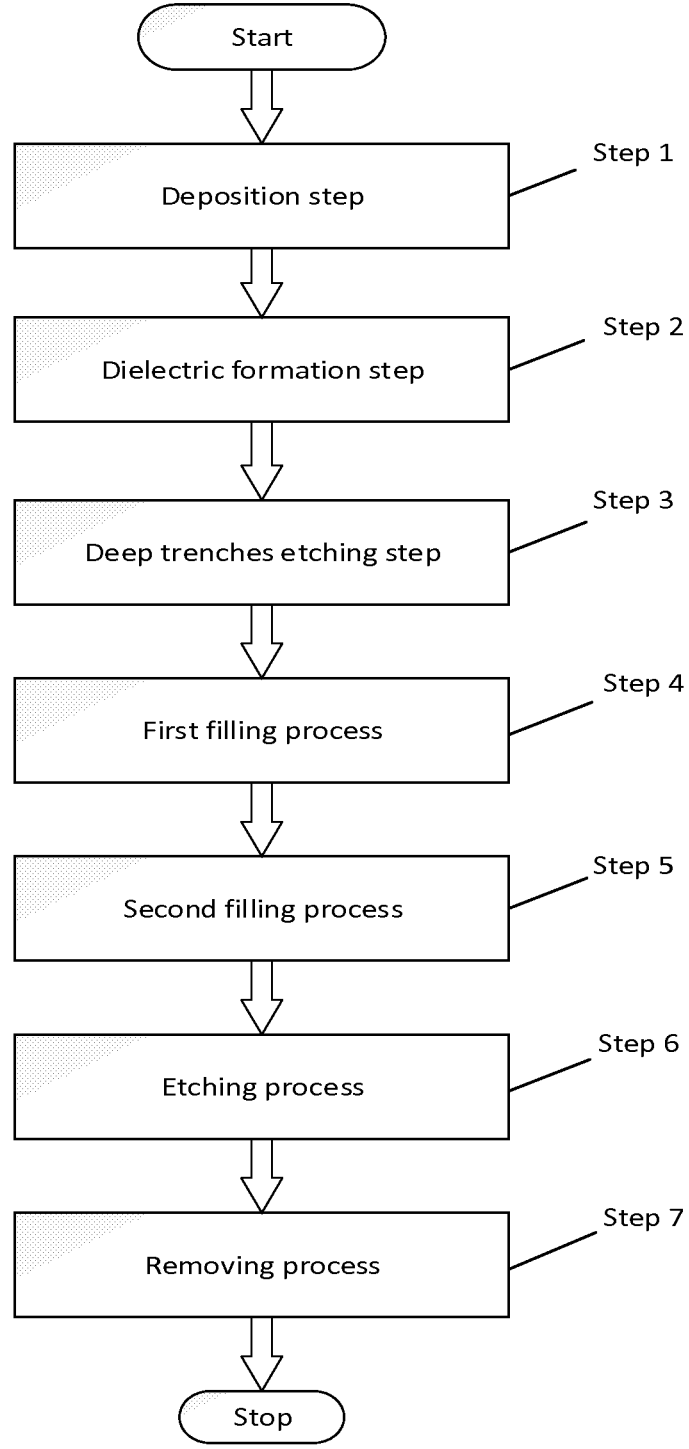
FIG. 1 illustrates an overall schematic flow diagram of a super PN junction fabrication process consistent with one embodiment of the present invention.

FIG. 1 illustrates an overall schematic flow diagram of a method for manufacturing a super PN junction consistent with one embodiment of the present invention.

Firstly, as shown in FIG. 1, in one embodiment, the method for manufacturing a super PN junction of the present invention mainly includes:

Step 1: a depostion step for forming an epitaxial layer on a substrate;

Step 2: a dielectrics forming step for forming the first dielectric layer and the second dielectric layer in sequence on the epitaxial layer;

Step 3: a deep trench forming step for forming deep trenches in the epitaxial layer;

Step 4: a first filling step for completely filling the trenches and beyond the second dielectric layer with an epitaxial material;

Step 5: a second filling step for form a surface filling layer with a predetermined thickness by completely filling the second dielectric layer and the epitaxial layer using a third dielectric;

Step 6: an etching process to etch back process on the surface filling layer to the interface of the first dielectric layer and the epitaxial layer; and Step 7: a removing step to remove the first dielectric layer, the second dielectric layer and the surface filling layer to planarize the epitaxial layer.

FIGS. 2-5 illustrate breakdown schematic diagrams of a method for manufacturing a super PN junction consistent with disclosed embodiments of the present invention.

The followings describe in detailed the Steps 1-7 with references to FIGS. 2-5.

Figure 2:
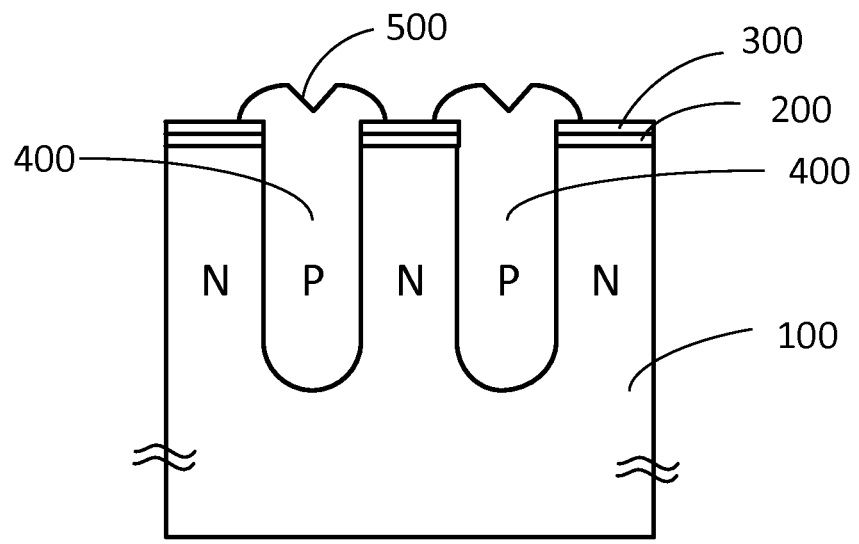
FIG. 2 illustrates a breakdown structure diagram of a super PN junction fabrication process consistent with one embodiment of the present invention.
Figure 3:
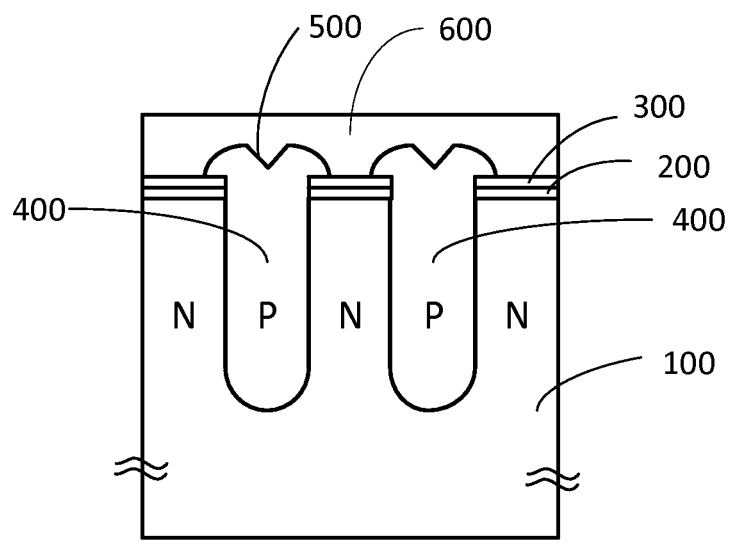
FIG. 3 illustrates a breakdown structure diagram of a super PN junction consistent with one embodiment of the present invention.
Figure 4:
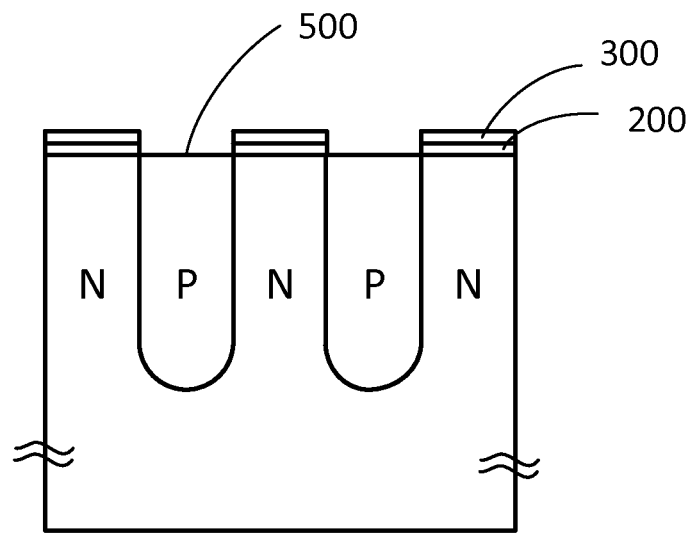
FIG. 4 illustrates a breakdown structure diagram of a super PN junction fabrication process consistent with one embodiment of the present invention.
Figure 5:
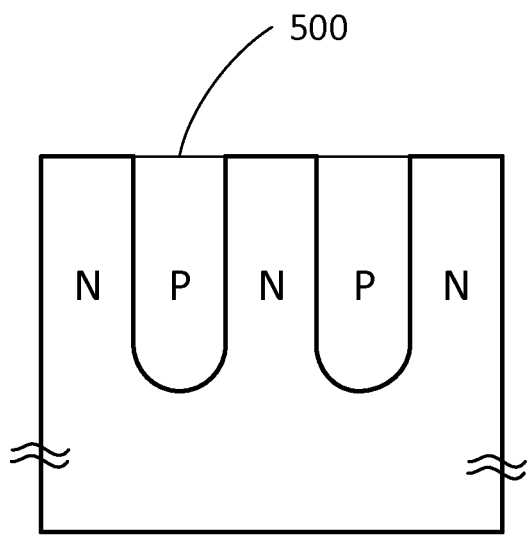
FIG. 5 illustrates a breakdown structure diagram of a super PN junction fabrication process consistent with one embodiment of the present invention.

As shown in FIGS. 2-5, the method for manufacturing a super PN junction consistent with one embodiment of the present invention mainly includes following steps:

Step 1: forming an epitaxial layer 100 on a substrate;

Step 2: a forming step for forming the first dielectric layer 200 and the second dielectric layer 300 in sequence on the epitaxial layer 100;

Step 3: forming deep trenches 400 in the epitaxial layer;

Step 4: as show in FIG. 2, completely filling the trenches 400 and beyond the second dielectric layer 300 with an epitaxial material 500;

Step 5: as shown in FIG. 3, covering and completely filling the entire surface of the second dielectric layer 300 and the epitaxial material 500 using a third dielectric layer 600, and forming a surface filling layer with a predetermined height;

Step 6: as shown in FIG. 4, etching back the surface filling layer to the interface of the first dielectric layer 200 and the epitaxial layer 100; and Step 7: removing the surface dielectric layer including the first dielectric layer 200, the second dielectric layer 300 and the surface filling layer to planarize the epitaxial layer.

Therefore, by filling the third dielectric material and using the etch back process to substitute the CMP process of the existing fabrication process, the problems caused by utilizing the CMP process for planarization, such as process complexity, difficult process control and high production cost, can be effectively be solved.

Further, other modified embodiments are also described below.

The third dielectric 600 is preferably a flowable material. For example, the third dielectric 600 can be SOG. So, in the Step 5, the entire surface of the second dielectric layer 300 and epitaxial material 500 shown in FIG. 2 can be completely filled with the flowable third dielectric 600 such as SOG to form the surface filling layer with a predetermined height.

Any appropriate accessory equipment can be used to fill the third dielectric 600. When using the accessory equipment to fill the third dielectric 600, the accessory equipment may spin and coat the flowable third dielectric 600 to completely fill the entire surface.

The term "predetermined height" herein refers to a height that is at least higher than the highest point of the epitaxial material 500.

In the step 6, as an etch back process, a plasma etching process may be used. In the plasma etching process, in order to obtain a flat etching of both the epitaxial material 500 and the third dielectric 600, the etching rate ratio (selectivity ratio) for the epitaxial material 500 and the third dielectric 600. For example, the selectivity ratio or the etching rate ratio of the epitaxial material 500 and the third dielectric 600 can be adjusted as 1:1. Thus, the same etching speed can be used to etch the epitaxial material 500 and the third dielectric 600 to ensure the flatness of the etched materials, and to achieve a planarization of the epitaxial material.

Here, Si may often be used as the epitaxial material 500. Further, in the Step 7, as a wet etching process may often be used to remove the first dielectric layer 200, the second dielectric layer 300 and the surface filling layer.

In addition, the first dielectric layer 200 herein may be made of oxide. The second dielectric layer 300 may be made of nitride. The thickness of the first dielectric layer is greater than 500 Å, and the thickness of the second dielectric layer is greater than 300 Å.

Thus, by using the present invention, because the epitaxial material is planarized by a method compatible with the existing fabrication process, the process is simple, the efficiency is high and no dedicated equipment is needed (CMP equipment). Therefore, the process cost is significantly reduced, and the unstable problems of Si devices caused by CMP the process can be effectively avoided.

The above examples mainly describe the fabrication process of a super PN junction. Although some embodiments are described in details, those skilled in the art should understand that the present invention may be implemented in other embodiments without departing from the purpose and the scope of the present invention. Therefore, the disclosed examples and embodiments are merely illustrative and not limiting. Without departing from the spirit and the scope of the present invention, various modifications and substitutions of those embodiments are within the scope of the present invention.

What is claimed is:

1. A method for forming a super PN junction, comprising:
    a deposition step for forming an epitaxial layer on a substrate;
    a dielectric forming step for forming of a first dielectric layer and a second dielectric layer in sequence on the epitaxial layer;
    a deep trench forming step for forming deep trenches in the epitaxial layer;

a first filling step before removing the second dielectric layer for completely filling the deep trenches and beyond the second dielectric layer with an epitaxial material;
a second filling step for forming a surface filling layer with a predetermined thickness by filling an entire surface including the second dielectric layer and the epitaxial material, using a third dielectric, wherein the third dielectric is SOG;
an etching step for etching back the surface filling layer and the epitaxial material to expose an interface of the first dielectric layer and the epitaxial layer on the substrate; and
a removing step for removing the first dielectric layer, the second dielectric layer and the surface filling layer to planarize the epitaxial layer.

2. The super-PN-junction forming method according to claim 1, wherein:
the etching process is a plasma etching process.

3. The super-PN-junction forming method according to claim 2, wherein:
the plasma etching process adjusts an etching rate selectivity ratio to obtain an etching rate selectivity ratio of 1:1 for the epitaxial material and the third dielectric.

4. The super-PN-junction forming method according to claim 3, wherein:
the first dielectric is oxide and the second dielectric is nitride.

5. The super-PN-junction forming method according to claim 2, wherein:
in the second filling process, the third dielectric is filled by an accessary equipment and the third dielectric is a flowable dielectric.

6. The super-PN-junction forming method according to claim 5, wherein:
a height of the surface filling layer is at least higher than a highest point of the epitaxial material.

7. The super-PN-junction forming method according to claim 6, wherein:
the first dielectric is oxide and the second dielectric is nitride.

8. The super-PN-junction forming method according to claim 5, wherein:
in the second filling process, the flowable third dielectric completely fills an entire surface of the second dielectric and the epitaxial material using a spin-coating process.

9. The super-PN-junction forming method according to claim 8, wherein:
the first dielectric is oxide and the second dielectric is nitride.

10. The super-PN-junction forming method according to claim 5, wherein:
a wet process is used to remove the first dielectric layer, the second dielectric layer, and the surface filling layer.

11. The super-PN-junction forming method according to claim 10, wherein:
the first dielectric is oxide and the second dielectric is nitride.

12. The super-PN-junction forming method according to claim 5, wherein:
in the first filling process, a lowest point of the epitaxial material is higher than the interface of the first dielectric and the epitaxial layer on the substrate.

13. The super-PN-junction forming method according to claim 12, wherein:
the first dielectric is oxide and the second dielectric is nitride.

14. The super-PN-junction forming method according to claim 5, wherein:
the first dielectric is oxide and the second dielectric is nitride.

15. The super-PN-junction forming method according to claim 2, wherein:
the first dielectric is oxide and the second dielectric is nitride.

16. The super-PN-junction forming method according to claim 1, wherein:
the first dielectric is oxide and the second dielectric is nitride.

17. The super-PN-junction forming method according to claim 16, wherein:
a thickness of the first dielectric is greater than 500Å, and a thickness of the second dielectric is greater than 300Å.

18. A method for forming a super PN junction, comprising:
a deposition step for forming an epitaxial layer on a substrate;
a dielectric forming step for forming of a first dielectric layer and a second dielectric layer in sequence on the epitaxial layer;
a deep trench forming step for forming deep trenches in the epitaxial layer;
a first filling step for completely filling the deep trenches and beyond the second dielectric layer with an epitaxial material;
a second filling step for forming a surface filling layer with a predetermined thickness by filling an entire surface including the second dielectric layer and the epitaxial material, using a third dielectric;
an etching step for etching back the surface filling layer to expose an interface of the first dielectric layer and the epitaxial layer on the substrate, wherein the etching process is a plasma etching process that adjusts an etching rate selectivity ratio to obtain an etching rate selectivity ratio of 1:1 for the epitaxial material and the third dielectric; and
a removing step for removing the first dielectric layer, the second dielectric layer and the surface filling layer to planarize the epitaxial layer.

19. A method for forming a super PN junction, comprising:
a deposition step for forming an epitaxial layer on a substrate;
a dielectric forming step for forming of a first dielectric layer and a second dielectric layer in sequence on the epitaxial layer;
a deep trench forming step for forming deep trenches in the epitaxial layer;
a first filling step for completely filling the deep trenches and beyond the second dielectric layer with an epitaxial material;
a second filling step for forming a surface filling layer with a predetermined thickness by filling an entire surface including the second dielectric layer and the epitaxial material, using a third dielectric, wherein the third dielectric is filled by an accessary equipment and the third dielectric is a flowable dielectric that completely fills the entire surface of the second dielectric and the epitaxial material using a spin-coating process;
an etching step for etching back the surface filling layer to expose an interface of the first dielectric layer and the epitaxial layer on the substrate; and
a removing step for removing the first dielectric layer, the second dielectric layer and the surface filling layer to planarize the epitaxial layer.

* * * * *